(12) United States Patent
Lin et al.

(10) Patent No.: US 6,669,367 B2
(45) Date of Patent: Dec. 30, 2003

(54) OPTICAL FIBER WITH MIRROR FOR SEMICONDUCTOR LASER

(75) Inventors: Chih-Hsiang Lin, Sugar Land, TX (US); Wen-Yen Hwang, Sugar Land, TX (US); Jun Zheng, Houston, TX (US); Stefan J. Murry, Houston, TX (US); James N. Baillargeon, Springfield, NJ (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 260 days.

(21) Appl. No.: 09/974,287

(22) Filed: Oct. 10, 2001

(65) Prior Publication Data

US 2003/0072523 A1 Apr. 17, 2003

(51) Int. Cl.⁷ .................... G02B 6/12; H01S 3/082; H01L 21/00
(52) U.S. Cl. .................... 383/14; 385/31; 385/88; 385/89; 372/92; 372/97; 372/98; 438/26; 438/27; 438/29
(58) Field of Search ................ 385/14, 15, 31, 385/129, 130, 131, 141, 88, 89, 92; 372/92, 97, 98, 99; 438/27, 28, 22, 26, 64, 65, 29

(56) References Cited

U.S. PATENT DOCUMENTS

| | | | | | |
|---|---|---|---|---|---|
| 4,452,533 A | * | 6/1984 | Miles et al. | ................ | 356/506 |
| 4,809,282 A | * | 2/1989 | Dewhirst | ................ | 372/16 |
| 4,860,304 A | * | 8/1989 | Mooradian | ................ | 372/92 |
| 5,216,680 A | * | 6/1993 | Magnusson et al. | .......... | 372/20 |
| 5,663,979 A | * | 9/1997 | Marshall | ................ | 372/103 |
| 5,699,377 A | | 12/1997 | Pan | ................ | 372/92 |
| 5,774,487 A | * | 6/1998 | Morgan | ................ | 372/45 |
| 5,796,764 A | * | 8/1998 | Corsini et al. | ................ | 372/6 |
| 5,930,430 A | | 7/1999 | Pan et al. | ................ | 385/94 |
| 6,137,812 A | * | 10/2000 | Hsu et al. | ................ | 372/6 |
| 6,263,002 B1 | | 7/2001 | Hsu et al. | ................ | 372/6 |
| 6,327,291 B1 | * | 12/2001 | Marshall | ................ | 372/75 |
| 6,351,482 B1 | * | 2/2002 | Puzey | ................ | 372/99 |
| 6,424,669 B1 | * | 7/2002 | Jiang et al. | ................ | 372/50 |
| 6,580,734 B1 | * | 6/2003 | Zimmermann | ................ | 372/29.02 |

OTHER PUBLICATIONS

Lin et. al., U.S. patent application Publication No. U.S. 2003/0072523 A1, published Apr. 17, 2003.*
Arbel et. al., U.S. patent aoplication Publication No. U.S. 2001/0046250A1, published Nov. 29, 2001.*
Zimmermann, U.S. patent application Publication No. U.S. 2002/0015433 A1, published Feb. 7, 2002.*
Hwang, U.S. patent application Publication No. U.S. 2002/0080836 A1, published Jun. 27, 2002.*

* cited by examiner

Primary Examiner—Brian Healy
(74) Attorney, Agent, or Firm—N. Stephan Kinsella

(57) ABSTRACT

A vertical-external-cavity surface-emitting laser (VECSEL) is formed by providing a monolithic portion having a first laser cavity mirror and an active region disposed on the first mirror. The cavity is completed with a second laser cavity mirror, such as a DBR, deposited onto the light-receiving end of an optical device, such as an optical fiber. The DBR-on-fiber-end is mounted with respect to the active region to complete the laser cavity and to provide automatic coupling of the output laser light into the fiber.

43 Claims, 2 Drawing Sheets

OPTICAL FIBER WITH MIRROR FOR SEMICONDUCTOR LASER

BACKGROUND OF THE INVENTION

1. Field of the Invention

This invention relates generally to devices that emit electromagnetic radiation and, in particular, to a laser assembly comprising an optical fiber coupled to a semiconductor laser having a bottom laser cavity mirror and a top cavity mirror.

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors, one of which is serves as the exit mirror. The area between the reflective planes is often referred to as the resonator, or the Fabry-Perot resonance cavity in some cases. When the active region is pumped with an appropriate pumping energy, it produces photons, some of which resonate and build up to form coherent light in the resonant cavity formed by the two mirrors. A portion of the coherent light built up in the resonating cavity formed by the active region and top and bottom mirrors passes through the exit mirror as the output laser beam.

Various forms of pumping energy may be utilized to cause the active region to begin to emit photons. For example, semiconductor lasers of various types may be electrically pumped (EP) (by a DC or alternating current), or pumped in other ways, such as by optically pumping (OP) or electron beam pumping. EP semiconductor lasers are typically powered by applying an electrical potential difference across the active region, which causes a current to flow therein. Electrons in the active region attain high energy states as a result of the potential applied. When the electrons spontaneously drop in energy state, photons are produced (to carry away the energy lost by the transition, so as to conserve energy). Some of those photons travel in a direction perpendicular to the reflectors of the laser. As a result of the ensuing reflections, the photons can travel through the active region multiple times.

Stimulated emission occurs when an electron is in a higher energy level and a photon with an energy nearly equal to the difference between the electron's energy and a lower energy interacts with the electron. In this case, the photon may stimulate the electron to fall into the lower energy state, thereby emitting a photon. The emitted photon will have the same energy as the original photon, and, if viewed as waves, there will be two waves emitted (from the electron's atom) in phase with the same frequency. Thus, when the photons produced by spontaneous electron transition photons interact with other high energy state electrons, stimulated emission can occur so that two photons with identical characteristics are present. If a sufficient number of the electrons encountered by the photons are in the high energy state, the number of photons traveling between the reflectors tends to increase, giving rise to amplification of light, and thus lasing. The result is that coherent light builds up in the resonant cavity formed by the two mirrors, a portion of which passes through the exit mirror as the output laser beam.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth an also the direction of emission of the output laser beam from the "top", exit mirror. Both EP and OP VCSEL designs are possible. VCSELs can have many attractive features compared to edge-emitting lasers, such as low threshold current, single longitudinal mode, a circular output beam profile, a smaller divergence angle, and scalability to monolithic laser arrays. The shorter cavity resonator of the VCSEL provides for better longitudinal mode selectivity, and hence narrower linewidths. Additionally, because the output is perpendicular to the wafer surface, it is possible to test fabricated VCSELs on the wafer before extensive packaging is done, in contrast to edge-emitting lasers, which must be cut from the wafer and at least partially packaged to test the laser. Also, because the cavity resonator of the VCSEL is perpendicular to the layers, there is no need for the cleaving operation common to edge-emitting lasers.

The VCSEL structure usually consists of an active (optical gain) region sandwiched between two mirrors (reflectors), such as distributed Bragg reflector (DBR) mirrors. The two mirrors may be referred to as the top (exit) DBR and the bottom DBR. Other types of VCSELs sandwich the active region between metal mirrors.

A VCSEL must have a means of pumping the active region to achieve gain. For example, in an EP VCSEL, top and bottom electrical contacts are typically provided above and below the active region, respectively, so that a pumping current can be applied through the active region. Because the optical gain is low in a vertical cavity design, the reflectors require a high reflectivity in order to achieve a sufficient level of feedback for the device to lase.

DBRs are typically formed of multiple pairs of layers referred to as mirror pairs. DBRs are sometimes referred to as mirror stacks. The pairs of layers are formed of a material system generally consisting of two materials having different indices of refraction and being easily lattice matched to the other portions of the VCSEL, to permit epitaxial fabrication techniques. The layers of the DBR are quarter-wave optical-thickness (QWOT) layers of alternating high and low refractive indices, where each mirror pair contains one high and one low refractive index QWOT layer. The number of mirror pairs per stack may range from 20–40 pairs to achieve a high percentage of reflectivity, depending on the difference between the refractive indices of the layers. A larger number of mirror pairs increases the percentage of reflected light (reflectivity).

The DBR mirrors of a typical VCSEL can be constructed from dielectric (insulating) or semiconductor layers (or a combination of both, including metal mirror sections). The difference in the refractive indices of adjacent layers in a DBR is referred to as the N-contrast from layer to layer. A lower N-contrast from layer to layer provides lower reflectivity, for a given number of mirror pairs. Semiconductor material typically has lower N-contrast than dielectric, and thus requires more layers for the same reflectivity. Thus, the difference between the refractive indices of the layers of the mirror pairs can be higher in dielectric DBRs, generally imparting higher reflectivity to dielectric DBRs than to semiconductor DBRs for the same number of mirror pairs and overall thickness. Conversely, in a dielectric DBR, a smaller number of mirror pairs can achieve the same reflectivity as a larger number in a semiconductor DBR. However, while a dielectric may function better as a DBR material in terms of reflectivity, it is not electrically conducting, which can be disadvantageous in some VCSEL applications. Thus, it is sometimes necessary or desirable to use semiconductor DBRs, despite their lower reflectivity/ greater thickness, to conduct current, for example (e.g., in an EP VCSEL). Semiconductor DBRs also have higher thermal (heat) conductivity than do dielectric DBRs, for a given thickness (although semiconductor DBRs tend to be thicker, for a given reflectivity, thus reducing or possibly eliminating its heat conductivity advantage, in some designs).

When properly designed, these mirror pairs will cause a desired reflectivity at the laser wavelength. Typically in a VCSEL, the mirrors are designed so that the bottom DBR mirror (i.e. the one interposed between the substrate material and the active region) has nearly 100% reflectivity, while the top DBR mirror has a reflectivity that may be 98%–99.5% (depending on the details of the laser design). The partially reflective top (exit) mirror passes a portion of the coherent light built up in the resonating cavity formed by the active region and top and bottom mirrors. The optical path of the light is referred to as the effective cavity length, which is equal to the physical length of the cavity augmented by the phase penetration depths for the top and bottom DBR mirrors. VCSELs, DBRs, and related matters are discussed in further detail in *Vertical-Cavity Surface-Emitting Lasers: Design, Fabrication, Characterization, and Applications*, eds. Carl W. Wilmsen, Henryk Temkin & Larry A. Coldren (Cambridge: Cambridge University Press, 1999). DBR penetration depth and related matters, in particular, are discussed in this text at section 3.2.2.

DBR reflectivity is characterized by a complex amplitude and phase spectrum. The amplitude or reflectivity spectrum indicates how much reflectivity the DBR has as a function of wavelength of light reflected. The phase spectrum determines how much phase shift (change) the DBR will impart to reflected light (either at the penetration depth or at the surface of the DBR), again, as a function of wavelength of the light reflected. The lasing wavelength of a VCSEL is determined by the gain spectrum of the active region, the reflectivity of the mirrors, the effective (optical) length of the resonance cavity, and any phase shift imparted by the mirrors. The optical cavity length depends on the physical length or distance between the DBRs as well as reflectivity characteristics of the DBRs. Thus, the physical distance between the DBRs, as well as the phase characteristics of the DBRs, affect the lasing wavelength. Both the reflectivity spectrum and phase characteristics of a DBR can be varied by changing the structural characteristics of the DBR, i.e. the number, composition, and thicknesses of the layers of the DBR.

In standard VCSELs, the active region and top and bottom mirrors are monolithically fabricated on a substrate. A variant on the standard VCSEL, an external cavity VCSEL, or vertical-external-cavity surface-emitting laser (VECSEL), is also in use. In this case, the active region and bottom mirror are monolithically fabricated on a substrate, while the top mirror is mounted externally, some distance (typically very small) above the active region. The term VCSEL may be used herein to refer to both standard (monolithic) VCSELs and VECSELs.

Long wavelength (1.3 $\mu$m to 1.55 $\mu$m) VCSELs are of great interest in the optical telecommunications industry because of the minimum fiber dispersion at 1310 nm and the minimum fiber loss at 1.55 $\mu$m (1550 nm).

VCSELs are used in a variety of applications. In telecommunications, for example, output laser light of a precise wavelength is modulated to encode and transmit information. The laser may be externally modulated, or directly modulated. A typical telecommunications system uses optical fiber to guide the radiation from the modulation (or emission) point to the detection point. When a fiber is used, it is necessary to couple the laser to the fiber, i.e. to couple the output laser light into the fiber end so that enough of the light is transmitted through the fiber core. The light output may be conditioned before it is coupled into a fiber; for example it may be amplified (e.g., by a semiconductor optical amplifier (SOA)) or modulated by a modulator. In this case, the laser must be coupled to the laser light-receiving or conditioning device, such as the SOA or modulator. Because the light conditioning device is coupled to the fiber, the laser is effectively coupled to the fiber by coupling it to the light conditioning device.

In various communications—e.g., telecommunications—applications, it is desirable that the emitted laser radiation of a given semiconductor laser have one of a number of precisely specified wavelengths, for example lasing wavelengths of 1310 nm (and other closely spaced wavelengths), or those specified by the ITU grid, such as lasing wavelengths of 1.55 $\mu$m (and other closely spaced wavelengths). For example, the ITU grid specifies 45 standard ITU wavelengths for DWDM, 100 GHz spacing, to-wit, 1528.77 nm (196.1 THz), 1529.55 nm (196.0 THz), . . . , to 1563.86 nm (191.7 THz). This standard varies the optical frequency in 100 GHz (0.1 THz) increments. Other wavelength standards may also be employed, e.g. using a 200 GHz or 50 GHz channel spacing plan derivative of the 100 GHz ITU standard. ITU grid wavelengths are used in telecommunications applications such as coarse and dense wavelength-division multiplexing (CWDM and DWDM). In WDM, typically used in optical fiber communications, two or more optical (e.g. laser) signals having different wavelengths are simultaneously transmitted in the same direction over one fiber, and then are separated by wavelength at the distant end.

For this reason, it is desirable to be able to fabricate VCSELs of specified, different output wavelengths, or to fabricate tunable VCSELs having a given wavelength range, a particular wavelength of which may be selected in accordance with a selectable tuning parameter. For example, VCSELs can have a wavelength (within a given range) significantly dependent on drive current (or some other tuning parameter).

BRIEF DESCRIPTION OF THE DRAWINGS

Other features and advantages of the invention will become apparent upon study of the following description, taken in conjunction with the attached FIGS. 1–5.

DETAILED DESCRIPTION OF THE INVENTION

The monolithic, semiconductor portion of an external cavity VCSEL (i.e., VECSEL) comprises an active region and a bottom cavity mirror. This portion of the VECSEL may be referred to herein as the monolithic VECSEL portion or VECSEL portion. The external, top (exit) cavity mirror must be added to complete the laser optical cavity and thus the VECSEL structure. The external, top cavity mirror is, in accordance with the present invention, disposed on the light-receiving (coupling) end of the optical device (e.g. fiber) to which the laser light is to be coupled. In an embodiment, the top mirror is a DBR, which is deposited onto the coupling end of a fiber (i.e. the end into which the laser light is to be coupled). As will be appreciated, the reflectivity and phase characteristics of the DBR may be selected as desired, to yield a desired lasing wavelength (or tuning range), for a given laser cavity structure (which cavity structure depends, in part, on the physical placement of the DBR-end fiber relative to the active region).

Figures 1, 2:
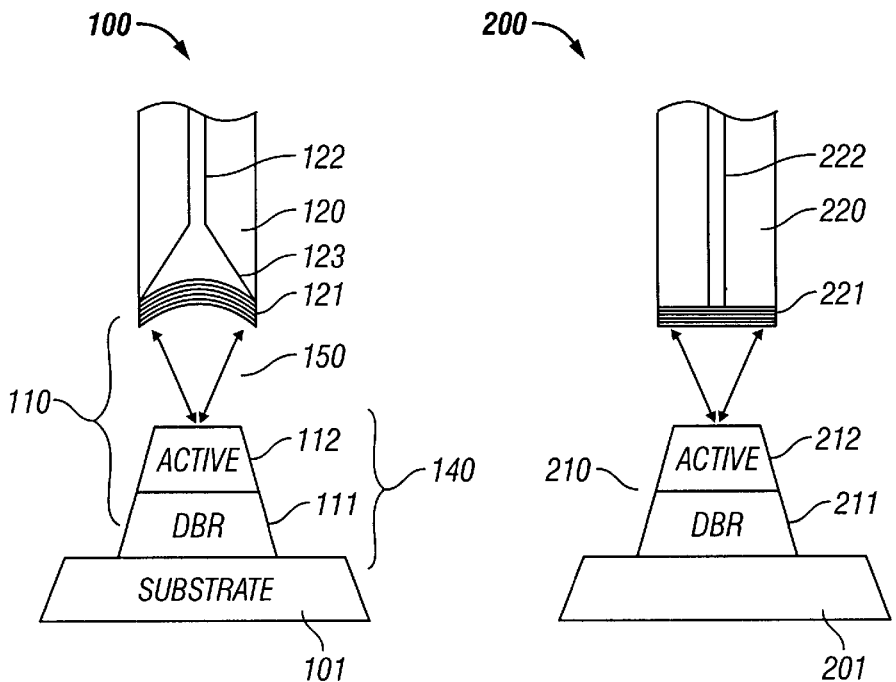
FIG. 1 shows a laser assembly comprising an optical fiber coupled to a semiconductor VECSEL laser having a concave top cavity mirror incorporated on the end of the fiber, in accordance with an embodiment of the invention.
FIG. 2 shows a laser assembly, having a having a flat, planar top cavity mirror incorporated on the end of the fiber, in accordance with an alternative embodiment of the invention.

Referring now to FIG. 1, there is shown a laser assembly 100 comprising an optical fiber 120 coupled to a semiconductor laser (VECSEL) 110. Laser 110 has a semiconductor laser portion 140 and a top cavity mirror 121. Semiconductor laser portion 140 comprises an active (gain) region 112 and a bottom laser cavity (bottom DBR) mirror 111, mounted on substrate 101. Top cavity mirror 121 is incorporated on the light-receiving (coupling) end of fiber 120, in accordance with an embodiment of the invention. Fiber 120 has a core 122, and a spherically-curved DBR mirror 121 deposited on its end. DBR 121 serves as the top cavity (exit) mirror of VECSEL 110.

Thus, VECSEL 110 has a bottom cavity mirror 111 and active region 112 on a monolithic semiconductor portion 140, and a top, external cavity mirror 121 disposed directly on the light-receiving end of the device to which the laser is to be optically coupled. Fiber 120 may have a diameter, e.g., of about 125 $\mu$m, and a core 122 diameter of about 10 $\mu$m. The diameter of the active region 112 is approximately 5 $\mu$m, in an embodiment. DBR 121 is preferably a dielectric DBR having about four to five mirror pairs, with a total thickness of about 1 to 2 $\mu$m, or a sufficient thickness and layer structure to provide a sufficiently high VECSEL top cavity mirror reflectivity (e.g., at least 99%) at the lasing wavelength.

As will be appreciated, the lasing wavelength $\lambda$ of VECSEL 110 is determined by a combination of characteristics of VECSEL 110, including the effective (optical) cavity length, gain spectrum of active region 112, reflectivity (or loss) spectrum of the top and bottom laser cavity mirrors, and any phase shift characteristics of the DBR mirrors. In particular, lasing is possible where gain (determined by the gain spectrum of the active region) is greater than loss (determined in part by the reflectivity of the DBR mirrors), and where the phase difference of a round trip of light within the optical cavity is zero. The wavelengths of light that will have such a zero phase difference are affected by the physical distance between the mirrors, and by the reflectivity and phase shifting characteristics of the DBR mirrors. For example, a given DBR mirror will add a particular effective optical path distance and will impart a particular phase shift to the light at the effective plane of reflection. Therefore, the physical placement of DBR 121 and fiber 120 with respect to VCSEL 110, as well as the phase shift characteristics of DBR 121, affect which wavelengths of light will have a zero round trip phase difference. As will be appreciated, the effective cavity length determines the free spectral range (spacing between lasing wavelengths). The effective cavity length combined with phase shift properties of the DBRs determines the precise location of the lasing wavelengths. Thus, by selecting the physical placement of the top DBR relative to the active region and by selecting a particular penetration depth for the top DBR, a desired free spectral range (spacing) can be selected. Changing only the phase-shifting characteristics tends to shift the lasing wavelengths, while maintaining the same spacing.

Thus, by selecting a DBR 121 with a given thickness, structure, and composition so that it has a particular reflectivity and phase spectrum, and by positioning fiber 120 and DBR 121 in a given location with respect to VCSEL 110, a particular wavelength may be achieved ("selected"). In particular, for a given lasing wavelength to be achieved, and for a given reflectivity and phase spectrum for the bottom DBR and for a given active region gain spectrum, and for a given desired physical cavity length and position to mount the top DBR with respect to the active region, the DBR on fiber end having the appropriate phase spectrum and/or reflectivity spectrum can be selected.

After selecting a given fiber with the most suitable DBR on fiber end, active alignment techniques may be employed to precisely position the DBR 121 to achieve the desired lasing wavelength. In an embodiment, bottom DBR 111 has a reflectivity of about 99.5% or greater at wavelengths at and around the desired lasing wavelength $\lambda$, and top (exit) cavity DBR 121 has a reflectivity of about 99% in a similar wavelength range. This is illustrated in further detail below with reference to FIGS. 4–5.

In an embodiment, DBR 121 has a spherically curved (concave) profile or surface to improve coupling of laser light into the cavity mode. I.e., the concave surface of the fiber end and DBR 121 ensures the cavity mode matches the fiber mode, and also selects the desired optical cavity mode, to form a more stable resonance cavity. This concave fiber end, and thus concave DBR 121, may be achieved by any suitable technique. In one embodiment, the end of a fiber is etched to have a concave profile. In another embodiment, the end of the fiber is ground to have a concave profile with a sphere-shaped polishing member, and then appropriately cleaned or polished. The DBR layers of DBR 121 are then deposited onto the concave end of the fiber 120 by suitable deposition techniques, such as sputtering. Other suitable (preferably non-epitaxial) deposition techniques such as e-beam evaporation or thermal evaporation (deposition), may also be employed to deposit the DBR onto the fiber end.

In an embodiment, as illustrated in FIG. 1, fiber 120 has a tapered core profile section 123 which improves the coupling of light into fiber core 122. In a typical optical fiber, the core section (e.g., 122) has a greater index of refraction than the cladding area, to achieve total internal reflection. Tapered profile 123 is achieved by having a larger core size (e.g., a diameter equal to that of the fiber) at the light receiving end, which gradually tapers down from approximately the diameter of the fiber at its light-receiving end, to a smaller, normal core size core 122. In alternative embodiments, a concave mirror 121 may be employed on a fiber having a non-tapered core.

As will be understood, the light-receiving end and second laser cavity mirror 121 of the optical fiber 120, and the monolithic VECSEL portion 140, may be mounted together in a housing or package so that the second laser cavity mirror 121 is precisely positioned over the active region 112 to complete the laser optical cavity bounded by the two cavity mirrors.

Thus configured, the active region has a gain spectrum with a maximum gain at or close to the lasing wavelength, i.e. close enough so that there is enough gain at the lasing wavelength, given the loss and reflectivity of the cavity mirrors, to give rise to lasing.

Referring now to FIG. 2, there is shown a laser assembly 200 comprising an optical fiber 220 coupled to a semiconductor laser 210 having a bottom laser cavity mirror 211, active region 212, and a top cavity mirror 221 incorporated on the end of fiber 220, in accordance with an alternative embodiment of the invention. Except as described below, laser assembly 200 and VECSEL 210 have similar characteristics as those of FIG. 1. Top cavity DBR 221 of VECSEL 210 is deposited onto the end of fiber 220, as in the embodiment of FIG. 1. However, unlike fiber 110, fiber 210 does not have a concave end. Instead, the DBR 221 is deposited directly on a substantially flat, planar end surface of fiber 220, again, with any suitable process, such as sputtering.

As with VECSEL 110, the lasing wavelength λ of VECSEL 210 is determined by the effective cavity length and gain spectrum of active region 212, where the effective cavity length is determined in part by the physical placement of DBR 221 and fiber 220 with respect to VCSEL 210 and in part by the phase shift characteristics of DBR 221.

Figure 4:
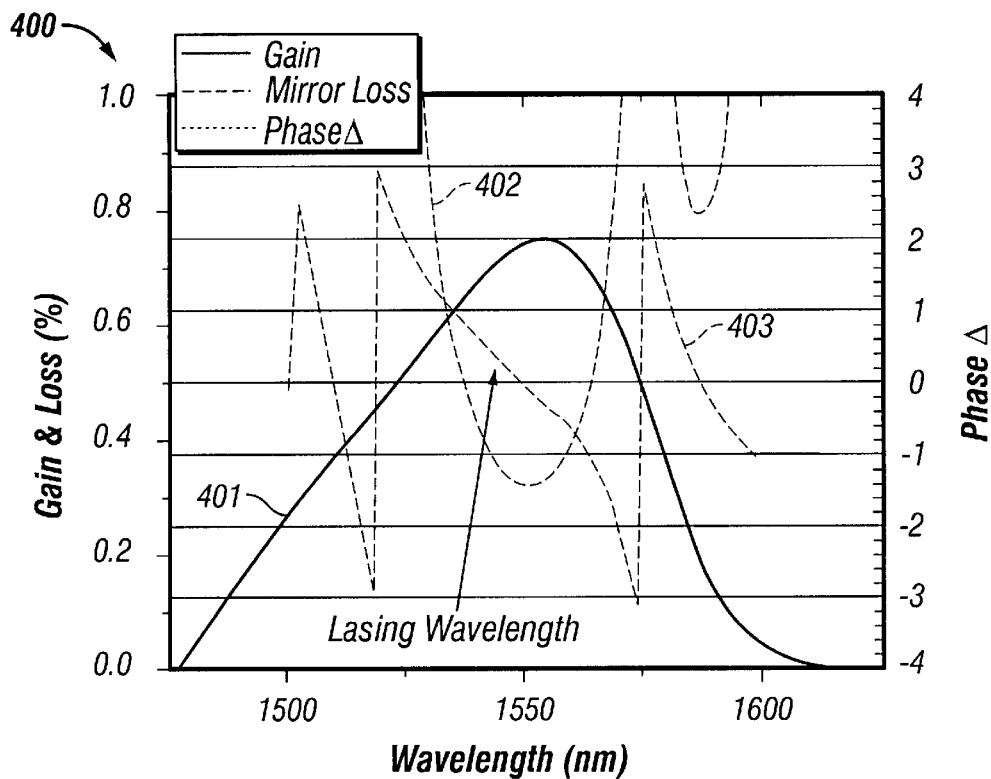
FIG. 4 is a graph plotting gain, top mirror reflectivity, and phase difference versus wavelength of the VECSEL of FIG. 1.

Referring now to FIG. 4, there is shown a graph 400 plotting gain, loss, and phase difference (delta) versus wavelength of VECSELs 110, 210 of FIGS. 1 and 2. The loss 402 corresponds to the top and bottom mirror reflectivity, i.e. a higher mirror reflectivity leads to lower loss. The phase difference 403 is the phase difference for a round trip of light of a given wavelength within the laser cavity.

As illustrated, the active region (112, 212) is designed to have a gain spectrum 401 as illustrated, with a maximum gain around 1550 nm. The top DBR mirror (121, 221), as well as bottom mirror (111, 211) are designed with structures giving rise to a reflectivity spectrum having a maximum around 1550 nm, which corresponds to the minimum loss around 1550 nm. Lasing is possible where the phase difference 403 has a zero crossing and where there is sufficient reflectivity and sufficient gain (i.e., where the gain exceeds the loss), in this example, at about 1550 nm. As will be appreciated, the reflectivity (loss) spectrum and the phase spectrum depend on the DBR structure, i.e. its overall thickness, and layer thicknesses and compositions. The simulated results plotted in FIG. 4 are based on a VECSEL structure similar to those of FIGS. 1 and 2, based on the assumptions shown in Table 1 below. Table 1 uses reference numerals from FIG. 1 for illustration, although applicable to the VECSEL structure of FIG. 2 as well.

TABLE 1

Assumptions for Simulations of Graph 400

| Layer | Index of refraction | Layer thickness (μm) | Times repeated | Material |
|---|---|---|---|---|
| Fiber core 122 | 1.449 | long | 1 | SiO$_2$ |
| top DBR 121 | 3.456/1.449 | 0.1121/0.2674 | 4 | Si/SiO$_2$ mirror pairs |
| air gap 150 | 1 | 18.529 | 1 | air |
| Active region 112 | 3.394 | 0.1142 | 4 | InGaAsP |
| Spacer layer | 3.165 | 0.1224 | 1 | InP |
| Bottom DBR 111 | 3.4820/3.165 | 0.1113/0.1240 | 39 | InP/InGaAlAs mirror pairs |
| Half mirror pair for bottom DBR 111 | 3.4820 | 0.1127 | 1 | InGaAlAs |
| substrate 101 | 3.165 | long | 1 | InP |

Thus, with these characteristics, a phase difference plot 403 as shown in FIG. 4 may result, having a zero crossing (indicating the possibility of lasing) at about 1550.17 nm.

Figure 5:
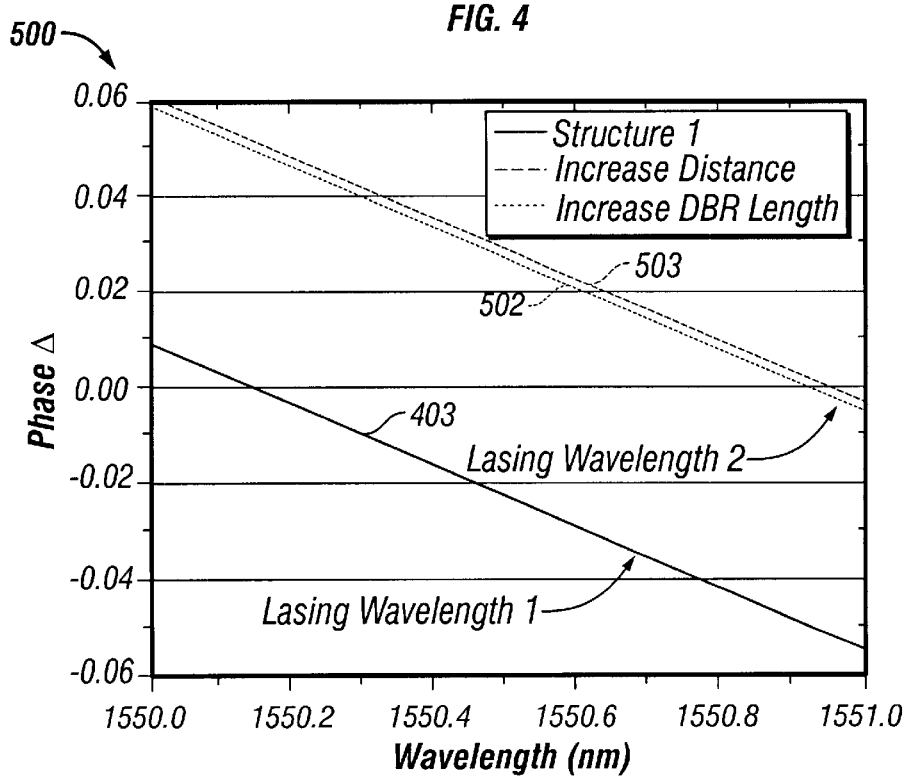
FIG. 5 is a graph plotting phase difference versus wavelength of the VECSEL of FIG. 1 under varying conditions.

The phase difference plot for a given laser structure also can be varied by changing the physical cavity length, i.e. by mounting the top DBR physically closer to or farther away from the active region, or by changing the top DBR structure to change its phase and reflectivity characteristics, as illustrated in FIG. 5. Referring now to FIG. 5, there is a graph 500 plotting phase versus wavelength of the VECSEL of FIGS. 1, 2 under varying conditions. Phase difference plot 403 from graph 400 illustrates the phase plot for a VECSEL of FIG. 1 (or FIG. 2) having the structure and assumptions given in Table 1. A zero crossing of plot 403 at about 1550.17 nm indicates that a first lasing wavelength (lasing wavelength 1) of about 1550.17 nm is achievable with these assumptions, assuming sufficient gain and reflectivity at that wavelength.

Phase difference plot 503 shows a shifted phase difference characteristic if the physical distance between top DBR 121 from active region 112 is increased, for example from 18.529 μm assumed in Table 1 to about 18.549 μm. As can be seen, this results in a different zero crossing at about 1551 nm and thus a different lasing threshold. Therefore, by mounting fiber 120 and top DBR 121 at a precise, selected axial distance away from active region 112, the lasing wavelength may be selected.

Phase difference plot 502 shows the change in phase difference resulting if the DBR 121 structure is changed from the structure of Table 1 by changing the thicknesses of the four Si/SiO$_2$ mirror pairs of the top DBR 121 are from thicknesses of 0.1121/0.2674 $\mu$m in Table 1, to about 0.1144/0.2728 $\mu$m. As will be appreciated, changing the structure and/or composition of the mirror pairs of a dBR has the effect of changing either/or the phase shift profile and/or the location of the effective reflective plane. Thus, changing the structure of the DBR can change either or both the phase shift it will impart to reflected light, and the extra effective optical path length added to the effective optical cavity. Because the thicknesses of mirror pair layers of a DBR are ideally QWOT, this may result in slightly "de-tuning" the DBR, i.e., the desired lasing wavelength and corresponding phase-difference zero crossing may be close to, but not exactly aligned with, the peak reflectivity of the DBR. This may be acceptable so long as the reflectivity of the top DBR at the lasing wavelength is sufficiently high, e.g. about 99%.

By increasing the length of DBR 121 by increasing its layer thicknesses, a different lasing wavelength will result, when the DBR is mounted the same distance (18.529 $\mu$m) away from the active region. This is illustrated in phase difference plot 502, which has a zero crossing at about 1551 nm and thus a different lasing wavelength. Therefore, by changing the structure and design of top DBR 121, the lasing wavelength may be selected for a given mounting position and VECSEL structure.

Figure 3:
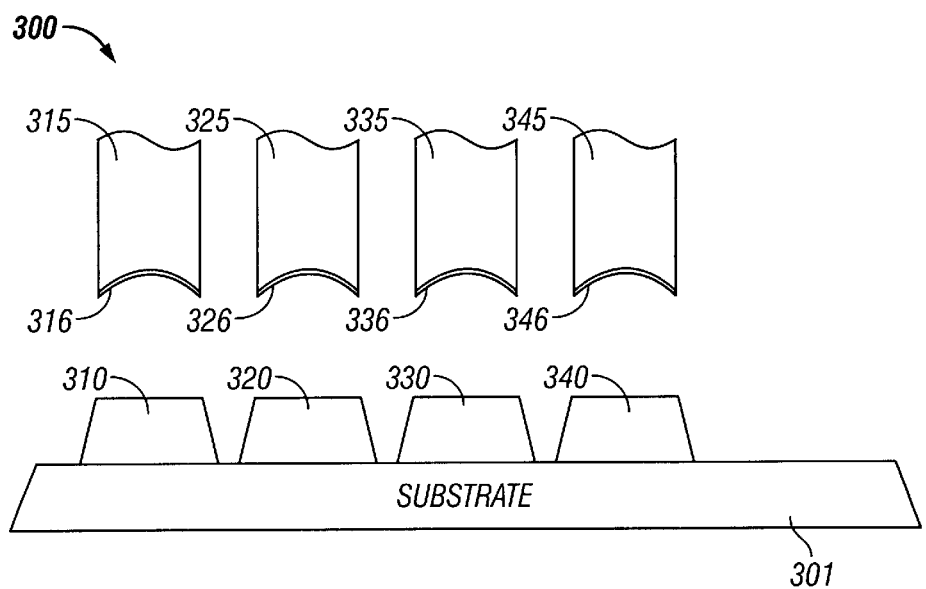
FIG. 3 depicts a VCSEL array comprising a plurality of VCSELs each coupled to a respective DBR-end fiber, in accordance with an alternative embodiment of the invention.

Referring now to FIG. 3, there is shown a VECSEL array 300, comprising a plurality of VECSELs each coupled to a respective DBR-end fiber. In an embodiment, each VECSEL 310, 320, 330, 340 of array 300 is identical to each other and similar to the VECSEL 110 of FIG. 1, and each fiber 315, 325, 335, 345 has a DBR 316, 326, 336, 346, respectively, on its coupling end similar to that of fiber 110 of FIG. 1, or of fiber 210 of FIG. 2. Fibers 315, 325, 335, 345 have different DBRs, i.e. the DBRs have unique phase characteristics so as to be suited for a particular lasing wavelength when positioned properly to optically couple with its respective VECSEL. For example, DBR-end fibers may be adapted so that each is suitable for one of the ITU grid wavelengths around the 1550 nm window. Thus, for example, VECSEL 310 coupled with fiber at a given, fixed distance 315 lases at 1528.77 nm; VECSEL 320 coupled with fiber 325 at the same fixed distance lases at 1529.55 nm; and so forth.

The invention in one embodiment comprises one or more DBR-end fibers such as those of FIG. 1 or 2 which are designed to couple to a VECSEL structure and to provide the top mirror for the VECSEL cavity and to couple the output light into the fiber. For example, a plurality of such DBR-end fibers may be provided. Of this plurality, the appropriate one is selected and mounted to a given VECSEL structure to provide an operational VECSEL lasing at the desired wavelength corresponding to the wavelength of the DBR-end fiber.

In an alternative embodiment, the tapered profile 123 characteristic of DBR-end fiber 120 may be combined with the planar (flat) DBR 221 of fiber 220.

In one embodiment, one or more identical DBR-end fibers may be provided. To form a VECSEL, one of the fibers is selected and mounted with the monolithic VECSEL portion at the desired position, to complete the cavity. In another embodiment, a plurality of DBR-end fibers may be provided, each having different characteristics than the others. For example, the DBRs may have different reflectivity spectra. For example, a first DBR-on-fiber-end may have a reflectivity peak at a first wavelength, while other DBRs have reflectivity peaks at other wavelengths. Then, to form a VECSEL with a given wavelength, the DBR-on-fiber-end with the optimal reflectivity spectrum is selected from the plurality, and mounted at an appropriate position with reference to the active region, to complete the laser cavity and simultaneously couple the fiber to the VECSEL.

In another embodiment, the DBRs may have different phase shift characteristics. For example, a monolithic VECSEL portion and related submount or package may be provided having a predetermined set of stops or other fiber coupling features, designed to mount a DBR-on-fiber-end at a predetermined, fixed distance from the active region. Given this fixed physical cavity length distance, a DBR having a suitable penetration depth and/or phase shift characteristic is selected, to achieve the desired lasing wavelength.

As described above, the present invention provides a fiber having incorporated in its coupling end a mirror suitable for use as the exit or top cavity mirror of a laser such as a VCSEL. In an alternative embodiment, such a fiber may be employed with any kind of semiconductor laser, such as any surface-emitting laser (SEL) or an edge-emitting laser.

In yet another embodiment, the top cavity mirror incorporated into the coupling end of the fiber may include a fiber Bragg (or photorefractive) grating (FBG) section formed in the fiber, in addition to the DBR. FBGs are structures of varying refractive index formed in the fiber core itself. This is usually accomplished by treating the fiber so that it becomes photosensitive and then exposing the fiber to UV light through a grating, which introduces periodic variations in the refractive index of the fiber. This forms a filter function due to interferometric effects. For example, a DBR having a certain reflectivity may be deposited onto the coupling end of the fiber, while a FBG section is present above the DBR, in the fiber, to provide additional, possibly narrower reflectivity. For example, the FBG may be designed to reflect at a narrow wavelength range, thereby helping to improve laser stability in that range. In general, the present invention contemplates the incorporation of any suitable laser cavity (exit) mirror onto the end of the fiber, whether DBR, DBR plus FBG, or other types of mirrors.

In another alternative, instead of depositing the DBR onto the coupling end of a fiber, the DBR may be deposited onto the light-receiving (coupling) end of an optical device other than fiber, to which the laser is to be coupled, such as an SOA, modulator, or isolator. Thus, for example, an SOA may have the DBR deposited on its light-receiving end, and mounted with respect to the VCSEL so that the DBR forms the exit cavity mirror, and the lasing output is coupled into the SOA. The SOA amplifies the signal, and may in turn be coupled at its output to a fiber.

In another embodiment, a third mirror may be employed to provide a two-section external cavity, where the first section is between the VCSEL structure and the DBR of the fiber, and the second section is between the DBR of the fiber and the third mirror. In this case, light emits from the active region, reflects off the exit mirror (DBR on fiber), onto the third mirror, where it is reflected back to the exit mirror and then to the bottom mirror. A portion of the light impinging on the exit mirror, from either or both the bottom mirror and the third mirror, is coupled into the fiber through the exit mirror.

In an embodiment, the bottom (first) laser cavity mirror that is part of the monolithic VECSEL portion need not necessarily be a DBR. It may be any suitable reflector or mirror, such as a metal mirror, or combination DBR/metal mirror.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. A laser apparatus comprising:
   (a) a first laser cavity mirror;
   (b) an active region disposed on the first mirror; and
   (c) a light-receiving optical device having a light-receiving end and a second laser cavity mirror disposed on said light-receiving end.

2. The laser apparatus of claim 1, wherein the light-receiving optical device is an optical fiber.

3. The laser apparatus of claim 1, further comprising a substrate having a surface, wherein the first laser cavity mirror is a first distributed Bragg reflector (DBR) disposed on the surface of the substrate.

4. The laser apparatus of claim 3, wherein:
   the light-receiving optical device is an optical fiber;
   the second laser cavity mirror is a second DBR having a plurality of layers disposed on the light-receiving end of the optical fiber; and
   the first DBR, the active region, and the second DBR form a vertical external-cavity surface-emitting laser (VECSEL) having an output coupled into said fiber.

5. The laser apparatus of claim 4, wherein said light-receiving end of the optical fiber and the second DBR have a concave profile.

6. The laser apparatus of claim 5, wherein said optical fiber has a core into which light from said active region is coupled through the second DBR, said optical fiber further comprising a tapered core profile that gradually tapers from approximately the diameter of said fiber at the light-receiving end to a smaller core diameter.

7. The laser apparatus of claim 4, wherein said optical fiber has a fiber Bragg grating (FBG) formed in said fiber core above said light-receiving end for providing additional, selective reflectance for said laser cavity.

8. The laser apparatus of claim 1, further comprising a monolithic portion comprising the a first laser cavity mirror and the active region, and a housing for mounting the light-receiving end and second laser cavity mirror of the light-receiving optical device so that the second laser cavity mirror is positioned over the active region to complete a laser optical cavity.

9. The laser apparatus of claim 2, wherein:
   the laser apparatus is for generating a laser output having a lasing wavelength;
   the active region has a gain spectrum with a maximum gain at about the lasing wavelength;
   the second laser cavity mirror is a second DBR having a plurality of layers disposed on the light-receiving end of the optical fiber;
   the first laser cavity mirror, the active region, and the second DBR form a vertical external-cavity surface-emitting laser (VECSEL) having an output coupled into said fiber; and
   the second DBR has a reflectivity of at least about 99% for light at about the lasing wavelength.

10. The laser apparatus of claim 9, wherein the second DBR is a dielectric DBR having a plurality of Si/SiO$_2$ mirror pairs.

11. The laser apparatus of claim 10, wherein:
    the lasing wavelength is about 1550 nm;
    the second DBR has about four mirror pairs; and
    the Si and SiO$_2$ layers of each mirror pair have approximately a quarter-wave optical-thickness.

12. A method for fabricating a laser having a particular lasing wavelength, comprising the steps of:
    (a) providing a monolithic VECSEL portion having a first mirror and an active region, the first mirror having a reflectivity of at least about 99.5% for light at about the lasing wavelength and the active region having a maximum gain at about the lasing wavelength;
    (b) selecting, from a plurality of optical fibers each having disposed on a light-receiving end thereof a second cavity mirror having a respective reflectivity and phase spectrum, one of said optical fibers the second cavity mirror of which has a phase spectrum and/or reflectivity spectrum corresponding to the lasing wavelength; and
    (c) mounting said optical fiber with respect to said laser portion so as to form a laser which will lase at said lasing wavelength.

13. The method of claim 12, wherein the monolithic VECSEL portion further comprises a substrate having a surface, wherein the first laser cavity mirror is a first distributed Bragg reflector (DBR) disposed on the surface of the substrate.

14. The method of claim 13, wherein:
    the second laser cavity mirror is a second DBR having a plurality of layers disposed on the light-receiving end of the optical fiber; and
    the first DBR, the active region, and the second DBR form a VECSEL having an output coupled into said fiber.

15. The method of claim 14, wherein said light-receiving end of the optical fiber and the second DBR have a concave profile.

16. The method of claim 15, wherein said optical fiber has a core into which light from said active region is coupled through the second DBR, said optical fiber further comprising a tapered core profile that gradually tapers from approximately the diameter of said fiber at the light-receiving end to a smaller core diameter.

17. The method of claim 12, further comprising the step of mounting the light-receiving end and second laser cavity mirror of the optical fiber, and the monolithic VECSEL portion, in a housing so that the second laser cavity mirror is positioned over the active region to complete a laser optical cavity.

18. The method of claim 12, wherein:
    the active region has a gain spectrum with a maximum gain at about the lasing wavelength;
    the second laser cavity mirror is a second DBR having a plurality of layers disposed on the light-receiving end of the optical fiber;
    the first laser cavity mirror, the active region, and the second DBR form a VECSEL having an output coupled into said fiber; and
    the second DBR has a reflectivity of at least about 99% for light at about the lasing wavelength.

19. The method of claim 18, wherein the second DBR is a dielectric DBR having a plurality of Si/SiO$_2$ mirror pairs.

20. The method of claim 19, wherein:
the lasing wavelength is about 1550 nm;
the second DBR has about four mirror pairs; and
the Si and SiO$_2$ layers of each mirror pair have approximately a quarter-wave optical-thickness.

21. A VECSEL array, comprising:
(a) a substrate having a surface;
(b) a plurality of VECSEL portions, one for each VECSEL of the array, each VECSEL portion comprising a first laser cavity mirror disposed on the surface of the substrate and an active region disposed on the first laser cavity mirror, wherein: each VECSEL is for lasing at a respective lasing wavelength; the first mirror has a reflectivity of at least about 99.5% for light at about the lasing wavelength; and the active region having a maximum gain at about the lasing wavelength; and
(c) a plurality of optical fibers, one for each VECSEL, each fiber having disposed on a light-receiving end thereof a second cavity mirror having a respective reflectivity and phase spectrum, each fiber being mounted over a corresponding one of the VECSEL portions so that its second laser cavity mirror is positioned over the active region to complete a laser optical cavity for each said VECSEL, wherein said second laser cavity mirror has a reflectivity of at least about 99% for light at about the lasing wavelength for its corresponding VECSEL.

22. The array of claim 21, wherein the second cavity mirror for each fiber is a dielectric DBR having a plurality of dielectric mirror pairs.

23. The array of claim 22, wherein said light-receiving end of the optical fibers and the second DBRs each have a concave profile.

24. The array of claim 21, wherein the active regions of the plurality of VECSEL portions are substantially identical.

25. The array of claim 21, wherein each VECSEL of the array is for lasing at a unique lasing wavelength.

26. The array of claim 25, wherein the second cavity mirror for each VECSEL has a phase spectrum and/or reflectivity spectrum corresponding to the lasing wavelength.

27. The array of claim 25, wherein: the active regions of the plurality of VECSEL portions are substantially identical; the second cavity mirrors have substantially identical phase and reflectivity spectrums; and each second cavity mirror is mounted at a different distance away from its respective active region to provide the lasing wavelength for said each VECSEL.

28. The array of claim 25, wherein: the active regions of the plurality of VECSEL portions are substantially identical; each second cavity mirror is mounted at a substantially identical distance away from its respective active region; and the second cavity mirrors each have a unique phase spectrum adapted to provide the lasing wavelength for said each VECSEL.

29. An optical fiber for use in a VECSEL comprising a VECSEL portion having a first laser cavity mirror and an active region, the active region having a maximum gain at about a lasing wavelength, the optical fiber comprising:
(a) an optical fiber portion having a core and a light-receiving end having an end surface; and
(b) a second laser cavity mirror disposed on said end surface adapted to complete a laser optical cavity of the VECSEL, the second laser cavity mirror having a sufficiently high reflectivity at about the lasing wavelength to permit the VECSEL to lase at the lasing wavelength.

30. The fiber of claim 29, wherein the first mirror has a reflectivity of at least about 99.5% for light at about the lasing wavelength and the second laser cavity mirror has a reflectivity of at least about 99% for light at about the lasing wavelength.

31. The fiber of claim 30, wherein the second laser cavity mirror is a second DBR having a plurality of Si/SiO$_2$ mirror pairs.

32. The fiber of claim 29, wherein:
the lasing wavelength is about 1550 nm;
the second laser cavity mirror is a second DBR having about four mirror pairs; and
the Si and SiO$_2$ layers of each mirror pair have approximately a quarter-wave optical-thickness.

33. The fiber of claim 32, wherein:
the second laser cavity mirror is a second DBR having a plurality of layers; and
the first laser cavity mirror, the active region, and the second DBR form the VECSEL having an output coupled into said fiber.

34. The fiber of claim 33, wherein said end surface of the optical fiber and the second DBR have a concave profile.

35. The fiber of claim 34, wherein light from said active region is coupled into the core through the second DBR, said optical fiber further comprising a tapered core profile that gradually tapers from approximately the diameter of said fiber at the light-receiving end to a smaller core diameter.

36. A method for forming an optical fiber for use in a VECSEL comprising a VECSEL portion having a first laser cavity mirror and an active region, the active region having a maximum gain at about a lasing wavelength, said method comprising the steps of:
(a) providing a fiber having a core and a light-receiving end having an end surface; and
(b) disposing a second laser cavity mirror on said end surface which second laser cavity mirror is adapted to complete a laser optical cavity of the VECSEL, the second laser cavity mirror having a sufficiently high reflectivity at about the lasing wavelength to permit the VECSEL to lase at the lasing wavelength.

37. The method of claim 36, wherein said step of disposing comprises the step of depositing a DBR onto said end surface to form said second laser cavity mirror.

38. The method of claim 37, wherein said step of depositing the DBR onto said end surface to form said second laser cavity mirror the step of depositing a plurality of Si/SiO$_2$ mirror pairs.

39. The method of claim 38, wherein:
the lasing wavelength is about 1550 nm;
the second laser cavity mirror is a second DBR having about four mirror pairs; and
the Si and SiO$_2$ layers of each mirror pair have approximately a quarter-wave optical-thickness.

40. The method of claim 36, wherein said end surface is initially substantially flat, the method further comprising the step of forming, before said disposing step, a concave end surface in said flat end surface.

41. The method of claim 40, wherein said forming a concave end surface comprises the step of grinding said flat end surface with a sphere-shaped polishing member.

42. The method of claim 40, wherein said forming a concave end surface comprises the step of etching said flat end surface to form said concave end surface.

43. The method of claim 36, wherein the first laser cavity mirror has a reflectivity of at least about 99.5% for light at about the lasing wavelength and the second laser cavity mirror has a reflectivity of at least about 99% for light at about the lasing wavelength.

\* \* \* \* \*